United States Patent
Jacquet

(10) Patent No.: US 7,569,889 B2
(45) Date of Patent: Aug. 4, 2009

(54) MEMORY INTEGRATED CIRCUIT, IN PARTICULAR AN SRAM MEMORY INTEGRATED CIRCUIT, AND CORRESPONDING FABRICATION PROCESS

(75) Inventor: François Jacquet, Froges (FR)

(73) Assignee: STMicroelectronics S.A., Montrouge (FR)

( * ) Notice: Subject to any disclaimer, the term of this patent is extended or adjusted under 35 U.S.C. 154(b) by 122 days.

(21) Appl. No.: 11/343,920

(22) Filed: Jan. 30, 2006

(65) Prior Publication Data

US 2006/0187702 A1 Aug. 24, 2006

(30) Foreign Application Priority Data

Feb. 2, 2005 (FR) .................................. 05 01037

(51) Int. Cl.
*H01L 29/76* (2006.01)
(52) U.S. Cl. ................. 257/369; 257/390; 257/E27.098
(58) Field of Classification Search ................. 257/369, 257/390, E27.098
See application file for complete search history.

(56) References Cited

U.S. PATENT DOCUMENTS

| | | | |
|---|---|---|---|
| 5,377,151 A | * | 12/1994 | Komuro ..................... 365/208 |
| 5,986,914 A | | 11/1999 | McClure |
| 6,430,076 B1 | | 8/2002 | Mueller et al. |
| 6,657,880 B1 | | 12/2003 | Callahan |
| 2001/0002882 A1 | | 6/2001 | Shimazaki et al. |
| 2002/0036943 A1 | | 3/2002 | Fujimoto |

FOREIGN PATENT DOCUMENTS

EP 0 593 152 4/1994

OTHER PUBLICATIONS

Preliminary French Search Report, FR 05 01037, dated Oct. 26, 2005.

* cited by examiner

*Primary Examiner*—Long Pham
(74) *Attorney, Agent, or Firm*—Gardere Wynne Sewell LLP

(57) ABSTRACT

A RAM memory integrated circuit, in particular a SRAM memory integrated circuit, includes a matrix of memory cells that are arranged between two bit lines via two access transistors. The bit lines are intended in one case to be discharged and in the other case to be maintained at a high precharge potential during a read operation. The bit line of each column of the matrix that is intended to be maintained at the high precharge potential is produced in the form of at least two partial bit lines. The memory cells of each column are implanted in the form of groups of cells which are alternately connected to one or the other of the partial bit lines, respectively.

15 Claims, 3 Drawing Sheets

MEMORY INTEGRATED CIRCUIT, IN PARTICULAR AN SRAM MEMORY INTEGRATED CIRCUIT, AND CORRESPONDING FABRICATION PROCESS

PRIORITY CLAIM

The present application claims priority from French Application for Patent No. 05 01037 filed Feb. 2, 2005, the disclosure of which is hereby incorporated by reference.

BACKGROUND OF THE INVENTION

1. Technical Field of the Invention

The present invention relates to integrated circuits, especially to memory circuits and in particular to static random access memory (SRAM memory) cells. More particularly, the invention relates to limiting the leakage currents in the transistors for accessing the static memory (SRAM memory) cells.

2. Description of Related Art

Memory cells, and in particular SRAM memory cells, are produced in the form of a matrix of memory cells that are arranged in rows and columns of memory cells and are connected in the differential mode between two bit lines. During a read operation, one of the bit lines after having been precharged to a high voltage is discharged, that is to say taken to the ground potential, whereas the other line is assumed to remain at its high precharge level.

FIG. 1 shows a conventional static memory cell.

As may be seen in this figure, the cell C consists of two inverters I1 and I2, which store one bit, and of two access transistors T1 and T2 via which the cell is connected to two complementary bit lines BL and BLB, which serve to read the memory location or to modify it. The input and the output of one of the inverters I1 communicate with the output and the input of the other inverter I2, respectively, and constitute nodes N1 and N2 respectively, the voltage levels of which correspond to the value of a stored bit. The two transistors are controlled by a word line WL for transferring the stored bit to the bit lines BL and BLB during a read operation or to impose the state of the lines BL and BLB to the memory location during a write operation.

In particular during an operation of reading a logic state 0 (and vice versa 1), the bit line BLB (and vice versa BL) precharged beforehand to a high voltage Vdd is discharged, whereas the bit line BL (and vice versa BLB) precharged beforehand to a high voltage Vdd is assumed to remain at its high level. Under the command of the access transistors T1 and T2, the nodes N1 and N2 are then positioned at 0 and at Vdd respectively (or vice versa at Vdd and at 0). However, leakage currents appear through the access transistors, and in particular in the access transistor T1 that connects the cell to the bit line BL maintained at its high precharge level.

Since a memory integrated circuit comprises a very large number of rows of memory cells, the sum of the leakage currents flowing through the access transistors for the set of rows results in a not insignificant modification in the level of the bit line BL that is assumed to remain in the high state (in the case in which the stored value corresponds to a logic 1), until a level from which the voltage differential between the two bit lines is no longer sufficient to ensure correct operation of the memory location, despite the presence of read amplifiers used to amplify the voltage difference between the two lines BL and BLB.

Consequently, the leakage currents created in the access transistors set a limit on the number of memory cells per bit line so as to avoid the risk of losing stored information.

In the state of the art, it has been proposed to alleviate this drawback by grouping memory locations together in the form of blocks of memory locations each connected to the bit line via a transfer port.

FIG. 2 shows the implementation of such a matrix of memory cells.

For the sake of clarity, only two columns of memory locations, including two bit lines BL0, BLB0 and BL1, BLB1, have been shown.

As may be seen in this figure, the memory locations, represented by their access transistors T and T', are grouped together in the form of blocks B1, B2, . . . , Bn that communicate with the bit lines BL0, BLB0 and BL1, BLB1 via transfer ports, such as P.

For the purpose of limiting the discharge of the overall bit lines, the number of memory locations in each block is limited to about 256 memory locations. Thus, even if leakage currents do appear in all the access transistors of one of the groups, the cumulative discharge generated in the bit lines remains insufficient to result in an overall discharge liable to cause a loss of information.

However, the production of memory locations requires very stringent fabrication constraints. Such constraints cannot be applied to the production of the transfer ports without incurring an unacceptable increase in the fabrication costs.

Furthermore, producing memory locations in the form of separate blocks results in discontinuities within the matrix, insofar as the memory locations lying in a heterogeneous environment are increased. Consequently, there is reduced matrix integration.

What is more, the relative slowness of the transfer ports impairs the overall performance of the matrix. Furthermore, these ports require their control to be synchronized with the control of the other ports and with the access transistors.

In the light of the foregoing, there is a need in the art to alleviate the foregoing drawbacks and, in particular, to provide a memory circuit and a corresponding fabrication process that limit the discharge of the bit lines to an acceptable level, without limiting the number of cells connected to the bit lines, while reducing matrix discontinuities.

SUMMARY OF THE INVENTION

Embodiments of the invention comprise a memory integrated circuit, in particular an SRAM memory integrated circuit, comprising a matrix of memory cells that are arranged in rows and columns of memory cells between two bit lines via two respective access transistors, the bit lines being intended in one case to be discharged and in the other case to be maintained at a high precharge potential during a read operation.

According to a general feature of the invention, the bit line of each column of the matrix that is intended to be maintained at the high precharge potential is produced in the form of at least two partial bit lines, the memory cells of each column being implanted in the form of groups of cells connected to the partial bit lines, respectively.

Such is also the case of the bit line of each column of the matrix, which is intended to be discharged, which is produced in the form of at least two partial bit lines to which the groups of memory cells are connected respectively.

These partial bit lines are produced in separate metallization levels of the integrated circuit.

According to yet another feature of the invention, the partial lines are each formed from successive portions of partial lines formed alternatively in the various metallization levels.

The groups of memory cells then are connected to the portions of partial lines produced in one of the metallization levels.

In one embodiment, the bit lines each comprise two partial bit lines each formed from portions of partial lines implanted alternately in the second and fourth or third and fifth metallization levels of the circuit, the groups of memory cells being connected to the portions of bit lines that are implanted in the second metallization level or the third level.

Another embodiment of the invention is a process for fabricating a memory integrated circuit, in particular an SRAM memory integrated circuit, which comprises a matrix of memory cells that are arranged in rows and columns of memory cells between two bit lines via two respective access transistors, the bit lines being intended in one case to be discharged and in the other case to be maintained at a high precharge potential during a read operation.

According to a general feature of this process the bit lines of each column of the matrix are each produced in the form of partial bit lines to which respective groups of memory cells of the column are connected.

In one method of implementation, the bit lines are produced in the form of successive portions of bit lines formed alternatively in separate metallization levels of the circuit, the groups of cells being connected to the portions of partial lines produced in one of the metallization levels.

In accordance with an embodiment of the invention, an integrated circuit memory comprises a bit line, a column of memory cells divided into at least a first, second, third and fourth group of cells, and a plurality of access transistors coupling the memory cells to the bit line, wherein the bit line comprises a first partial bit line and a second partial bit line each extending along the column, the first partial bit line coupled through access transistors to the first and third groups of cells and the second partial bit line coupled through access transistors to the second and fourth groups of cells.

In accordance with another embodiment, an integrated circuit memory comprises a plurality of memory cells in a column, and a bit line coupled to the memory cells in the column, the bit line comprising first and second segments each extending along the column of memory cells, the first and second segments each divided into successive line segment portions, which line segment portions alternatively couple to groups of memory cells along the column.

In accordance with another embodiment, an integrated circuit memory comprises a matrix of SRAM memory cells wherein each row of SRAM memory cells lies between and is coupled to complementary bit lines via two respective access transistors, each complementary bit line being produced in the form of two partial bit lines, the SRAM memory cells of each column comprising plural groups of cells, wherein alternate groups of cells are connected to one or the other of the two partial bit lines, and each partial bit line is formed of consecutive portions wherein alternate portions lie in different metallization layers of the integrated circuit memory.

BRIEF DESCRIPTION OF THE DRAWINGS

A more complete understanding of the method and apparatus of the present invention may be acquired by reference to the following Detailed Description when taken in conjunction with the accompanying Drawings wherein.

DETAILED DESCRIPTION OF THE PREFERRED EMBODIMENTS

Figure 3:
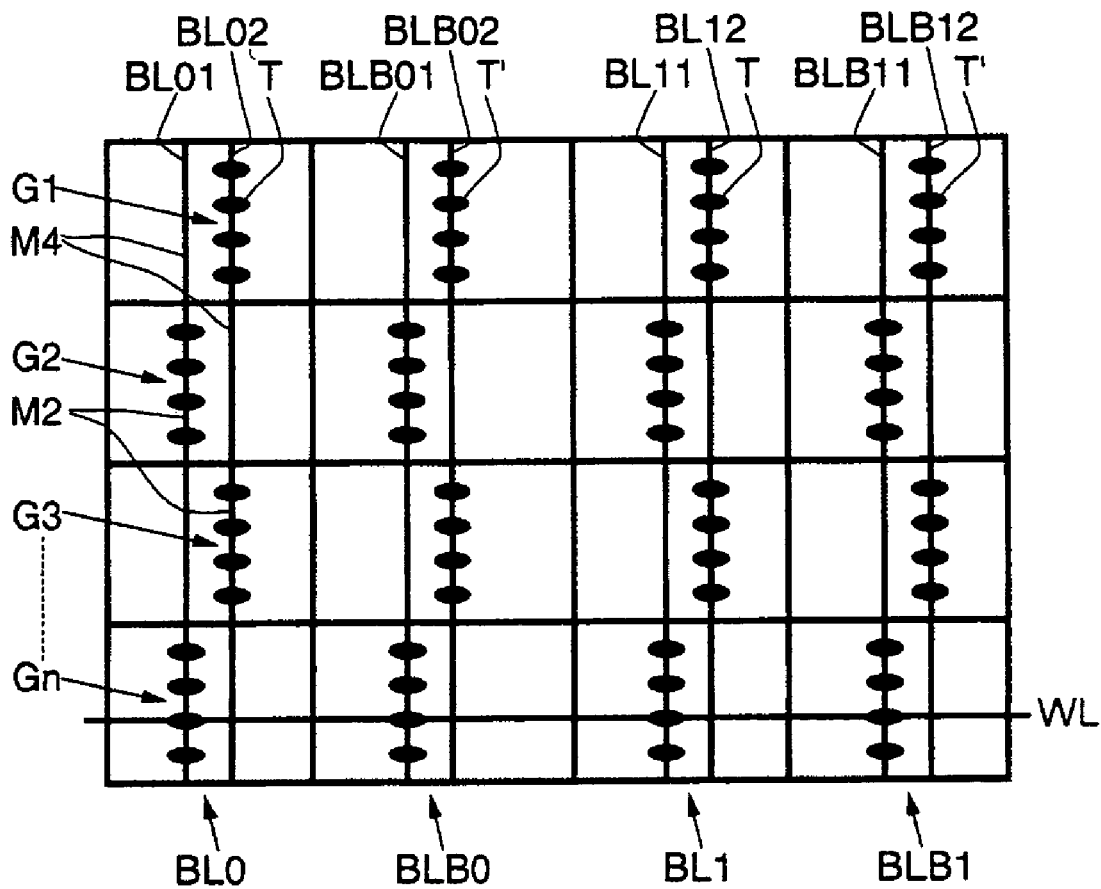
FIG. 3 shows the implantation of a matrix of memory cells according to the invention.

FIG. 3 shows an exemplary implantation of a matrix of memory cells according to an embodiment of the invention.

Figure 1:
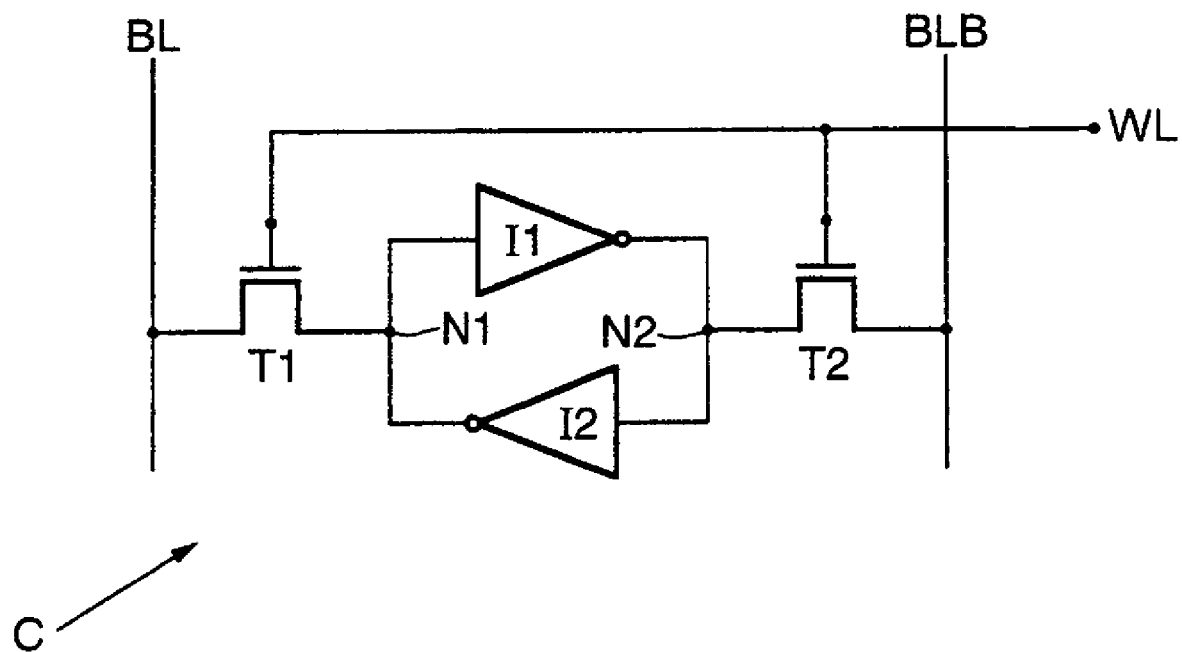
FIG. 1, already mentioned, illustrates the construction of a memory locations cell.
Figure 2:
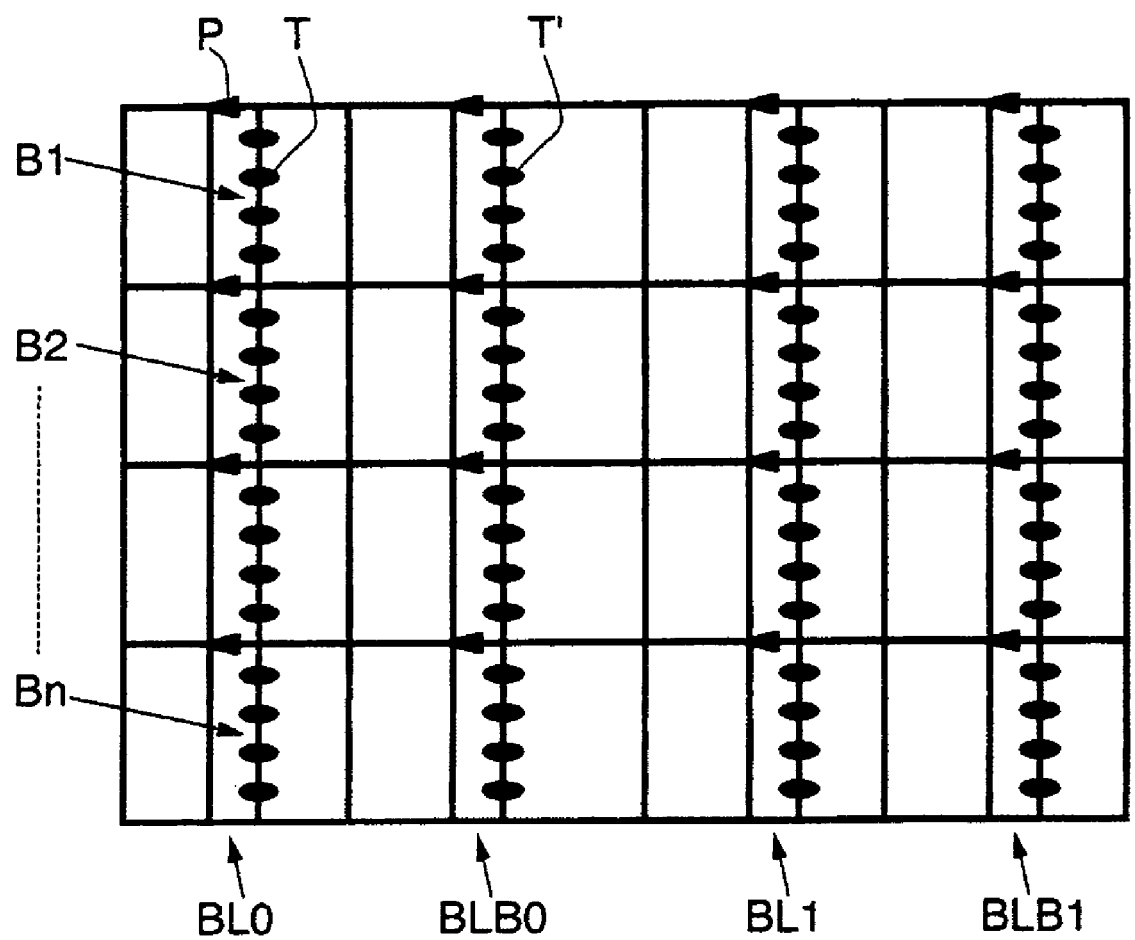
FIG. 2, examined above, illustrates an example of implantation of a matrix of memory locations according to the prior art.

Each memory cell or location is formed by a conventional memory cell, which may be identical to the cell described above with reference to FIG. 1, which includes two inverters I1 and I2 used for storing a bit connected to two bit lines BL and BLB via two access transistors T1 and T2 driven via the same word line WL.

In FIG. 3, for the sake of clarity only two columns of memory locations, arranged in rows and columns of memory locations, have been shown. The memory locations have been illustrated by their access transistors T and T' connected to the bit lines BL0 and BLB0 on the one hand, and BL1, BLB1 on the other.

The matrix shown in FIG. 3 comprises in fact two pairs of bit lines, mainly the pairs of bit lines BL0 and BLB0 on the one hand, and the bit lines BL1 and BLB1 on the other.

As in the prior art, one of the bit lines of each pair, namely the bit lines denoted by the references BLB0 and BLB1 (and vice versa BL0 and BL1) are intended, during an operation of reading a logic state 0 and after having been precharged to a high voltage, to be discharged, that is to say to be taken down to earth potential, whereas the other bit line, namely the bit lines denoted by the references BL0 and BL1 (and vice versa BLB0 and BLB1) are intended to remain in their high precharge state.

For the purpose of alleviating the drawbacks associated with the appearance of leakage currents within the access transistors, in particular within the access transistors connected to the bit line intended to remain in its high state during a read operation, this bit line, but also, in the exemplary embodiment shown, the other bit line, that is to say the bit line intended to be discharged during reading, are produced in the form of two partial bit lines BL01 and BL02 on the one hand, and BLB01 and BLB02 on the other, as regards the first column of memory locations, and BL11, BL12 on the one hand, and BLB11 and BLB12 on the other, with regard to the other column of memory locations.

The memory locations are arranged in the form of groups, such as G1, G2, G3 and G4, the groups G1, G2, G3 and G4 of each bit line being alternately connected to one partial bit line and to the other.

Thus, for example as regards the bit line BL0, the first group G1 of memory locations is connected to the partial bit line BL02, the second group G2 of memory locations is connected to the partial bit line BL01, the third group G3 of memory locations is connected to the partial bit line BL02 and the fourth group G4 of memory locations is connected to the first partial bit line BL01.

Figure 4:
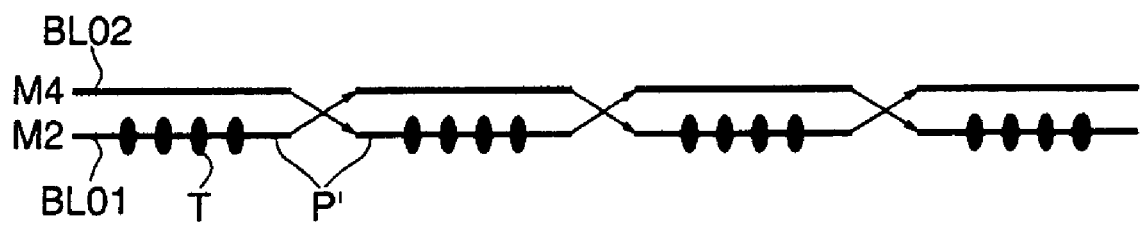
FIG. 4 is a schematic sectional view of the matrix of FIG. 3.

To do this, again referring to FIG. 3, each partial bit line is produced in the form of successive partial line portions, such as P' (see also, FIG. 4). The successive portions of each partial bit line are alternately formed in two separate metallization levels of the circuit, in this case the metallization levels M2 and M4. Thus, for example when a first portion P' of the bit line BL02 is formed in the metallization level M2, the successive portion P' of BL02 is formed in the higher metallization level M4. Such is also the case for the other partial bit line, the portions of which are formed alternately in the metallization levels M2 and M4. However, when one of the portions P' of one of the partial bit lines is formed in one of the metallization levels, the corresponding portion of the other partial bit line is formed in the other metallization level.

As regards the access transistors, these are connected to the portions of partial bit lines in the lower metallization level, that is to say the metallization level M2.

The word line WL, which drives the access transistors T and T' is, for its part, produced in the metallization level M3.

In the exemplary embodiment shown, each bit line is divided into two partial bit lines to which successive groups of memory locations are alternately connected.

Of course, depending on the number of memory locations to be integrated, it is also possible, as a variant, to produce each bit line in the form of a large number of partial bit lines so as to increase the number of memory locations of the matrix, while still limiting the number of memory locations connected to each partial line.

As will have been understood, thanks to the invention, in which the bit lines are divided into partial lines to which corresponding groups of memory locations are connected, the leakage currents liable to discharge the bit lines are reduced. In particular, when the memory locations are connected to two partial bit lines, the sum of the leakage currents liable to affect the potential of the bit line is reduced by a factor of two. Furthermore, this advantage may be obtained without the use of transfer ports, while still eliminating any matrix discontinuities within the circuit.

Although preferred embodiments of the method and apparatus of the present invention have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth and defined by the following claims.

What is claimed is:

1. A memory integrated circuit, in particular an SRAM memory integrated circuit, comprising:
    a matrix of memory cells that are arranged in rows and columns of memory cells between two bit lines via two respective access transistors, the bit lines being intended in one case to be discharged and in the other case to be maintained at a high precharge potential during a read operation, wherein the bit line of each column of the matrix that is intended to be maintained at the high precharge potential is produced in a form of at least two partial bit lines, the memory cells of each column being implanted in a form of groups of cells connected to the partial bit lines, respectively,
    wherein the bit lines each comprises two partial bit lines each formed from portions of partial lines implanted alternately in a second and a fourth or a third and a fifth metallization levels of the circuit, groups of memory cells being connected to portions of bit lines that are implanted in the second metallization level or the third level.

2. The circuit according to claim 1, wherein, additionally, the bit line of each column of the matrix, which is intended to be discharged, is produced in a form of at least two partial bit lines to which the groups of memory cells are connected respectively.

3. A memory integrated circuit, in particular an SRAM memory integrated circuit, comprising:
    a matrix of memory cells that are arranged in rows and columns of memory cells between two bit lines via two respective access transistors, the bit lines being intended in one case to be discharged and in the other case to be maintained at a high precharge potential during a read operation, wherein the bit line of each column of the matrix that is intended to be maintained at the high precharge potential is produced in a form of at least two partial bit lines, the memory cells of each column being implanted in the form of groups of cells connected to the partial bit lines, respectively,
    wherein the partial bit lines are produced in separate metallization levels of the integrated circuit.

4. The circuit according to claim 3, wherein the partial lines are each formed from successive portions of partial lines formed alternatively in the separate metallization levels.

5. The circuit according to claim 4, wherein the groups of memory cells are connected to the portions of partial lines produced in one of the metallization levels.

6. An integrated circuit memory, comprising:
    a bit line;
    a column of memory cells divided into at least a first, second, third and fourth group of cells;
    a plurality of access transistors coupling the memory cells to the bit line;
    wherein the bit line comprises a first partial bit line and a second partial bit line each extending along the column, the first partial bit line coupled through access transistors to the first and third groups of cells and the second partial bit line coupled through access transistors to the second and fourth groups of cells,
    wherein the first and second partial bit lines rest in a lower metallization layer when coupling to memory cells and rest in a higher metallization layer otherwise.

7. The memory of claim 6 wherein each of the first and second partial bit lines is divided into a plurality of portions including a first portion formed in the lower metallization layer which is coupled to the access transistors and a second portion formed in the higher metallization layer.

8. An integrated circuit memory, comprising:
    a plurality of memory cells in a column; and
    a bit line coupled to the memory cells in the column, the bit line comprising first and second segments each extending along the column of memory cells, the first and second segments each divided into successive line segment portions, which line segment portions alternatively couple to groups of memory cells along the column,
    wherein a line segment portion coupled to a group of memory cells rests in a lower metallization layer and a line segment portion not coupled to a group of memory cells rests in a higher metallization layer.

9. The memory of claim 8 wherein the bit line comprises a bit line true for the column of memory cells.

10. The memory of claim 8 wherein the bit line comprises a bit line complement for the column of memory cells.

11. An integrated circuit memory comprising:
    a plurality of memory cells in a column; and
    a bit line coupled to the memory cells in the column, the bit line comprising first and second segments each extending along the column of memory cells, the first and second segments each divided into successive line segment portions, which line segment portions alternatively couple to groups of memory cells along the column;
    the bit line comprising a true bit line and a complement bit line for the column of memory cells, and each of the true bit line and complement bit line comprises first and second segments each extending along the column of memory cells, the first and second segments each divided into successive line segment portions, which line segment portions alternatively couple to groups of memory cells along the column.

12. An integrated circuit memory comprising:

a plurality of memory cells in a column; and a bit line coupled to the memory cells in the column, the bit line comprising first and second segments each extending along the column of memory cells, the first and second segments each divided into successive line segment portions, which line segment portions alternatively couple to groups of memory cells along the column;

wherein a line segment portion coupled to a group of memory cells rests in a lower metallization layer and a line segment portion not coupled to a group of memory cells rests in a higher metallization layer and wherein word lines for the memory cells of the column rest in a metallization layer between the lower and higher metallization layers.

13. The memory of claim 8 wherein the memory cells are SRAM cells.

14. An integrated circuit memory, comprising:

a matrix of SRAM memory cells wherein each row of SRAM memory cells lies between and is coupled to complementary bit lines via two respective access transistors, each complementary bit line being produced in the form of two partial bit lines, the SRAM memory cells of each column comprising plural groups of cells, wherein alternate groups of cells are connected to one or the other of the two partial bit lines, and each partial bit line is formed of consecutive portions wherein alternate portions lie in different metallization layers of the integrated circuit memory.

15. The memory of claim 14 wherein a portion lies in a lower metallization layer when coupled to a group of memory cells, and wherein a portion lies in a higher metallization layer when not coupled to a group of memory cells.

* * * * *